Figure 1:
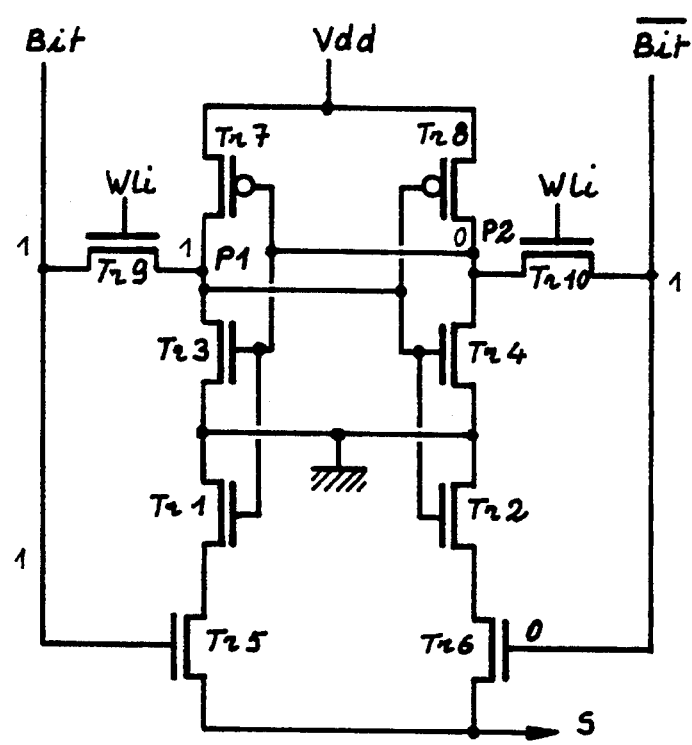

United States Patent [19]
Ali-Yahia et al.

[11] Patent Number: 5,386,379
[45] Date of Patent: Jan. 31, 1995

[54] MEMORY CELL FOR ASSOCIATIVE MEMORY

[75] Inventors: Tahar Ali-Yahia, Viroflay; Michel Dana, Paris, both of France

[73] Assignee: France Telecom, Establissement Autonome De Droit Pub., France

[21] Appl. No.: 997,931

[22] Filed: Dec. 29, 1992

[30] Foreign Application Priority Data

Jan. 3, 1992 [FR] France ................ 92-00024

[51] Int. Cl.6 .................................. G11C 15/00
[52] U.S. Cl. ........................ 365/49; 365/156; 365/189.05; 365/190
[58] Field of Search .......... 365/49, 189.05, 156, 365/190

[56] References Cited

U.S. PATENT DOCUMENTS

| | | | |
|---|---|---|---|
| 3,936,811 | 2/1976 | Horninger | 365/49 |
| 4,853,892 | 8/1989 | Hori | 365/49 |
| 4,965,767 | 10/1990 | Kinoshita et al. | 365/49 |
| 5,034,919 | 7/1991 | Sasai et al. | 365/49 |
| 5,036,486 | 7/1991 | Noguchi et al. | 365/49 |
| 5,051,949 | 9/1991 | Young | 365/49 |

FOREIGN PATENT DOCUMENTS 2549998  2/1985  France .

*Primary Examiner*—Joseph A. Popek
*Assistant Examiner*—Christopher R. Glembocki
*Attorney, Agent, or Firm*—Pearne, Gordon, McCoy & Granger

[57] ABSTRACT

The invention relates to a memory cell for a static associative memory comprising two arrays of transistors, a first array having a data storage function and a second array having a comparison function between the stored data item and a data item applied to the input of the cell, the comparison result being obtained on a selection line S, in which the second array (T1,T2,T3,T4) of transistors is partly formed by the transistors of the first array (T3,T4,T7,T8,T5,T6). The structure of the cell thus has reduced overall dimensions compared with known structures.

5 Claims, 2 Drawing Sheets

MEMORY CELL FOR ASSOCIATIVE MEMORY

DESCRIPTION

The invention relates to a memory cell for an associative memory and an associative memory having a memory plane constituted by an array of said cells.

For any application requiring an associative processing, existing solutions make use of associative memories having a memory plane constituted by an array of CMOS static memory cells. Each cell is constituted by six transistors for storing the information and a comparison logic incorporating four transistors. This solution has been used in associative memories for "Data Flow" computers (Matsushita Electrical Industrial, Japan) and whereof a more detailed description is provided in the article by Hiroshi Kadota et al entitled "An 8-Kbit Content-Addressable and Reentrant Memory", published in IEEE Journal of Solid State Circuits, volume SC-20, No. 5, Oct. 1988, pp. 543–547.

This solution has also been used for local networks (AMD, Am99C10) and whereof details of the circuit appear in the article (in French) entitled "Give it the password and the memory will find the information", Electronique Hebdo, No. 97, p.19, 1989.

In order to increase the storage capacity of associative memories and comply with operations and constraints specific to certain applications which static memory cells cannot satisfy, several memory cell solutions have been proposed. Among these specific constraints, reference is e.g. made to the case of simultaneous writing on several words of the memory.

As a solution, reference can be made to pseudo-static memory cells with eight transistors, used in an associative memory dedicated to the processing of the signal and pictures. A detailed description is provided in the article by Simon R. Jones et al entitled "A 9 Kbit Associative Memory for High-Speed Parallel Processing Applications", published in IEEE Journal of Solid State Circuits, volume 23, No. 2, April 1988, pp. 543–547.

Reference can also be made to memory cells with seven NMOS transistors, plus two poly-Si resistive moding elements, which are used in an associative memory for artificial intelligence applications and whereof a detailed description is given in the article by Takeshi Ogura et al entitled "A 20 Kb CMOS Associative Memory Lsi for Artificial Intelligence Applications", published in Proceedings of the IEEE int., during the Computer Design conference (ICCD 86), pp. 574–577.

Reference can also be made to dynamic memory cells with five transistors used in an associative memory for speeding up the retrieval operations in data bases. A more detailed description is provided in the article by J. P. Wade and Ch. G. Sodina entitled "Dynamic Cross-Coupled Bit-Line Content Addressable Memory Cell for High-Density Array", published in IEEE Journal of Solid State Circuits, volume SC-22, No. 1, February 1987, pp. 119–121.

However, the construction of associative memories using solutions based on memory planes constituted by static associative memory cells with ten transistors in CMOS technology of the type described hereinbefore, leads to limited storage capacities. Thus, in order to solve an associative retrieval problem requiring a significant storage capacity, it is necessary to have a larger number of associative memory processors, so that such solutions then become very expensive.

Solutions based on dynamic associative memory cells with five transistors in NMOS technology, lead to a significant improvement in the storage capacity, but are slower, because it is necessary to carry out a refreshing stage for the memory cells following each operation, so that a supplementary consumption source is required.

The present invention makes it possible to solve this problem. It relates to a high density memory cell and an associative memory having a memory plane constituted by such memory cells and whose degree of integration and capacity are consequently increased.

The use of such memory cells makes it possible to achieve on a single circuit a storage capacity equivalent to 512 Kbit for applications not requiring a multiple response control (e.g. cache memories) and on the other increase the spheres of use of an associative memory, utilizing the surface gain obtained for integrating supplementary processing units.

Thus, the present invention makes it possible to obtain large capacity associative memories, whilst also increasing their spheres of application, because it is possible to achieve a space gain for a given storage capacity, so that operators can be added to the integrated circuit.

The present invention more specifically relates to a memory cell for a static associative memory comprising two arrays of transistors, a first array having a data storage function and a second array having a comparison function between the stored data item and a data item applied to the input of the cell, the comparison result being obtained on a selection line S, the second array of transistors being partly formed by the transistors of the first array. According to a first embodiment, the first array comprises on the one hand four transistors for storage purposes and on the other two access transistors connected to two bit lines and one word line, the second array comprising two transistors, the two unloading transistors of the cell being associated with these two transistors of the second array in order to ensure the comparison function, the data item to be compared being applied to the bit lines connected to the two access transistors of the cell and the selection line S being preloaded during reading-writing operations and during comparisons.

According to a second embodiment, the first array comprises on the one hand four transistors for storage purposes and on the other two access transistors connected to two bit lines and one word line, the second array comprising two transistors, the two transistors N ensuring the unloading of the cell being associated with the two transistors of the second array in order to fulfil the comparison function, the data item to be compared being applied to two other bit lines (COMP, $\overline{COMP}$) connected to the two transistors of the second array.

According to another aspect of the invention, the memory cells are in CMOS technology.

The present invention also relates to a static associative memory comprising a memory plane constituted by an array of memory cells.

The invention is described in greater detail hereinafter relative to non-limitative embodiments and with reference to the attached drawings, wherein show:

FIG. 1 a diagram of a static memory cell with ten transistors according to the prior art.

Figure 2:
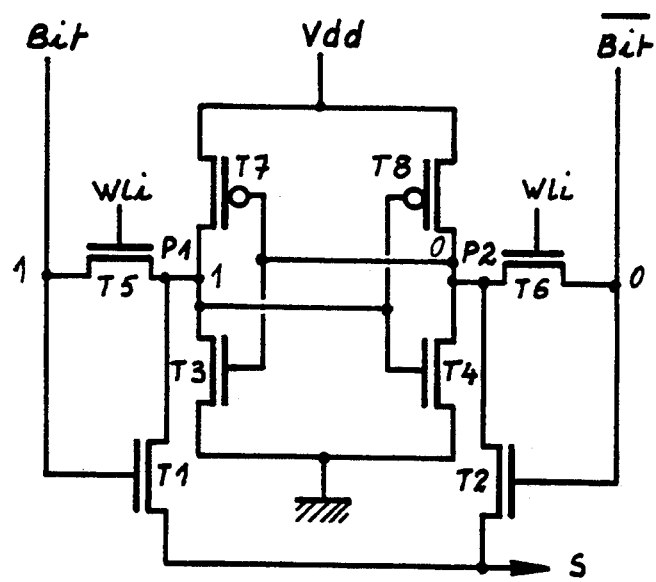

FIG. 2 a diagram of a static memory cell according to a first embodiment of the invention.

Figure 3:
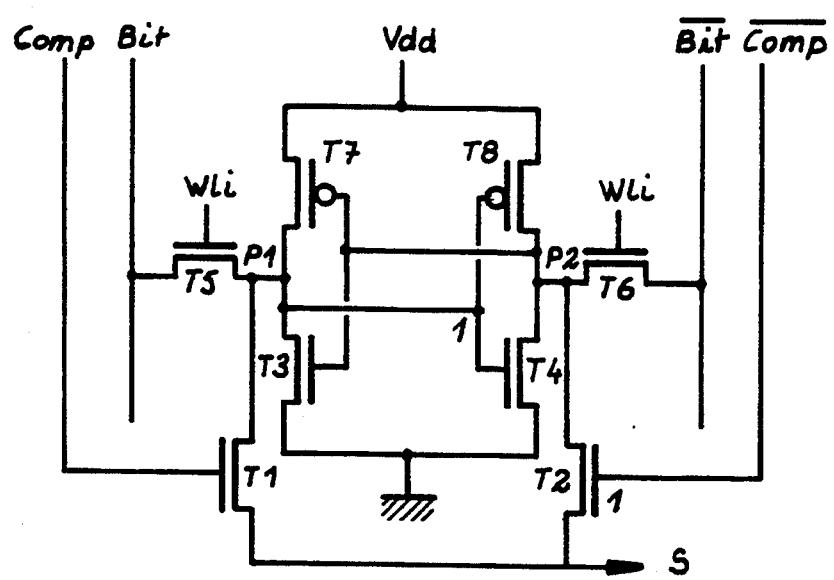

FIG. 3 a diagram of a static memory cell according to a second embodiment of the invention.

A description will now be given of the operation of a static memory cell having ten transistors according to the prior art, said memory cell being shown in FIG. 1.

In a static associative memory, each memory cell of the memory plane has a first array of transistors performing a storage function and a second array performing a comparison function.

Thus, in an associative memory, each memory cell is associated, in the memory plane, with a supplementary logic ensuring the performance of selection operations, whose principle is based on an equality or similarity test.

The first array of transistors (fulfilling the storage function) has four transistors forming a double inverter. The transistors forming this double inverter carry the references TR3,TR4,TR7, TR8. This storage array also has two access transistors TR9 and TR10, which are connected by their gate to a word line WLI and by their drain to the bit lines BIT and $\overline{BIT}$.

The second array of transistors is formed by the transistors TR1,TR2,TR5,TR6 forming an exclusive-OR-type gate. The transistors T1 and T2 are connected to the storage array by their sources (or drains) to the sources (or drains) of the transistors TR3 and TR4 and by their gates to the gates of the transistors TR3,TR4 and TR7,TR8. The source (or drain) of the transistors TR5,TR6 is connected to a selection line S. The gates of the transistors TR5,TR6 are connected to the bit lines BIT and $\overline{BIT}$.

The cells P1 and P2 are storage cells for the data written into the memory cell. A reading operation takes place in the manner described hereinafter.

For explanation purposes it is assumed that a data item has been recorded and corresponds to state 1. Thus, P1 is at state 1 and P2 at state 0. The bit lines BIT and $\overline{BIT}$ are preloaded to voltages between 2.5 and 5 V. The word line WLI is selected by the application of a voltage making conductive the transistors TR9 and TR10. According to the present example P1=1 and P2=O and the cell P1 cannot be unloaded, whereas the line $\overline{BIT}$ will be unloaded across TR4 and TR10. The values of P1 and P2 appear on the lines BIT and $\overline{BIT}$.

A writing operation takes place in the following way. It is e.g. assumed that P1 is at state 1 and P2 at state 0 and that it is wished to write 0 in P1 and 1 in P2. A 0 will be inputted by means of the line BIT and a 1 on the line $\overline{BIT}$. The word line WLI will then be selected by applying a voltage corresponding to the logic state 1 for the line WLI. P1 is unloaded and leads to the switching of the memory cell and the cell P2 then passes to state 1.

A comparison operation takes place as follows. It is assumed that the cell P1 is equal to 1 and the cell P2 equal to 0. A voltage corresponding to the state 0 is applied to the line WLI.

It will be assumed that equality exists between the inputted data item and the recorded data item. The selection line S is preloaded, i.e. is positioned at state 1. Thus, 1 is applied to the line BIT and 0 to the line $\overline{BIT}$. The transistor TR5 becomes conductive and the transistor TR1 remains blocked. The selection line S is not unloaded and remains at 1.

The transistor TR6 is blocked and the transistor TR2 conductive. The selection line S can no longer be unloaded by this path and remains at state 1. The fact that the selection line does not change state makes it possible to conclude that equality exists between the inputted data item and the stored data item.

If the inputted data item is different from that recorded in P1, the transistor TR5 is blocked and so is the transistor TR1. The selection line S is unable to be unloaded by this path. However, the transistor TR6 becomes conductive, as does the transistor TR2. Thus, an unloading path for the line S is created and passes through the transistors TR6 and TR2. S is unloaded and consequently passes to state 0. It is then known that the inputted value differs from the stored value.

FIG. 2 shows a static memory cell with eight transistors corresponding to a first embodiment of the invention.

The first array of transistors fulfilling the storage function for the cell is formed by the transistors T3,T4,T7 and T8, as well as the access transistors T5 and T6. These access transistors are connected on the one hand to the word line WLI and on the other to the lines BIT and $\overline{BIT}$.

According to the invention, the second array fulfilling the comparison function between an inputted data item and a stored data item in the memory cell comprises two transistors T1 and T2 connected to the access transistors T3,T5,T4 and T6. The comparison function is fulfilled by the exclusive-OR logic gate obtained by these two transistors T1 and T2 associated with the transistors T3 and T4 of the memory cell. The transistors T1 and T2 are connected to the selection line S by their drain (or source) and to the bit lines by their gate.

According to this embodiment, the reading and writing operations require the selection line S to be preloaded (S=1). This avoids the transistors of the comparison logic T1,T2 forming an unloading path from the storage cell to the P1 and P2 and consequently the memory cell stability is not compromised.

The operating procedure of the memory cell according to this first embodiment will now be described.

A reading operation involves the following stages. The selection line S is preloaded to 1. The lines BIT and $\overline{BIT}$ (BIT=1 and $\overline{BIT}$=1) are preloaded and the word line WLI is positioned at 1. It is assumed that P1=1 and P2=0. The line $\overline{BIT}$ will be unloaded across T4 and T6 and the values P1 and P2 will be obtained on the lines BIT and $\overline{BIT}$.

A writing operation involves the following stages. It is e.g. wished to write 0 at cell P1 and 1 at cell 2. Then a 0 is applied to the line BIT and a 1 to the line $\overline{BIT}$. The line WLI is positioned at 1. The transistors T5 and T6 are conductive. The cell P1 is unloaded into the line BIT across T5, P2 is forced to 1 by the switching of the memory cell.

A comparison operation involves the following stages. The selection line S is preloaded and S is equal to 1.

For explanation purposes it is assumed that the inputted data item is e.g. equal to 0, i.e. different from the data item recorded in cell P1. Therefore a 0 is applied to the bit line and a 1 to the line $\overline{BIT}$. The word line WLI is at state 0. Thus, the transistor T1 is blocked, as is the transistor T3. The transistor T2 is conductive and the transistor T4 receives the value from the cell P1 and becomes conductive. Thus, an unloading path for the line S is created and this path passes through the transistors T2 and T4. S is unloaded and passes to state 0, which differs from the value of the cell P1.

Thus, it can be concluded that the inputted data item differs from the recorded data item, because the state of the line S is changed.

It will now be shown that when the inputted data item corresponds to the data item recorded at P1, there is no change to the state of the line S.

Thus, the line BIT is equal to 1, the line $\overline{\text{BIT}}$ equal to 0, P1 is equal to 1 and P2 is equal to 0. Therefore the transistor T1 is conductive and the transistor T3 is blocked (state 0 of P2 is applied to its gate). The transistor T2 is blocked and T4 is conductive (its gate is at state 1 from P1). Thus, there is no unloading path for the line S.

Thus, this structure corresponds to a static associative memory cell having the advantage of reduced overall dimensions as compared with the prior art.

FIG. 3 shows a second embodiment of a memory cell according to the invention. In this embodiment, the transistors T1 and T2 of the logic comparison array have their gate connected to two other bit lines COMP, $\overline{\text{COMP}}$. These bit lines make it possible to input the data item to be compared with the recorded data item in the memory cell P1.

Thus, according to this embodiment, there is no need for a preloading of the selection line S during the reading-writing operations, as was e.g. the case for the first embodiment described relative to FIG. 2. According to this embodiment, a reading operation takes place in the following way.

The lines BIT and $\overline{\text{BIT}}$ are positioned at 1. It is e.g. assumed that the cell P1 is at 1 and the cell P2 at 0. The word line WLI is selected by positioning it at state 1. The line $\overline{\text{BIT}}$ is unloaded across the transistors T6 and T4. Thus, the value of the cell P1 is found on the line BIT and the value of the cell P2 on the line $\overline{\text{BIT}}$.

A writing operation takes place in the following way. If it is wished to write a 0 at cell P1 and therefore a 1 at cell P2, the line BIT is positioned at 0 and the line $\overline{\text{BIT}}$ at 1. The word line WLI is selected by positioning it at state 1. The point P1 is unloaded across T5 and is therefore at state 0, whilst the cell P2 is forced to the value 1 by the switching of the memory cell. Thus, the values inputted by the lines BIT and $\overline{\text{BIT}}$ are found in cells P1 and P2.

A comparison operation takes place as follows. The selection line S is preloaded by positioning it at 1. The word line is positioned at 0. It is then assumed that the data item 0 has been inputted for comparing it with the value of the recorded item. Consequently the line COMP is positioned at 0 and the line $\overline{\text{COMP}}$ at 1. Therefore the transistor T1 is blocked and so is the transistor TR3. The transistor T2 is conductive, as is the transistor T4. Thus, an unloading path for the line S across the transistors T2 and T4 is created. The line S which was preloaded at state 1 changes state to pass to 0. It can then be concluded that the inputted data item differs from the recorded data item. In the opposite case, there is no state change on the part of the line S and it is then concluded that the inputted data item is the same as the recorded data item.

The structure described hereinbefore renders it unnecessary to preload the selection line during reading-writing operations, because it makes it possible to isolate the comparison logic from the memory cell. This memory cell structure can be obtained with existing technologies and preferably with a technology having three metal levels.

Thus, for the two proposed memory cell architectures, the selection operation, i.e. the comparison takes place in accordance with the following stages:
- preloading the selection lines S,
- positioning on the bit lines (the lines COMP for the second architecture) the data item to be compared, as well as its complementary item,
- performing the comparison by means of the exclusive-OR structure formed by the transistors T1,T2,T3,T4.

If equality is proved, the selection lines remain preloaded. In the opposite case, they are unloaded, across one of the branches created by the transistors T1,T3 or T2,T4.

The two structures described hereinbefore have reduced overall dimensions and consequently for a given memory surface increase the integration density and capacity thereof. As has been seen a non-destructive reading of the content is ensured by them.

We claim:

1. Memory cell for a static associative memory comprising two arrays of transistors, a first array having a data storage function and a second array having a comparison function between a stored data item and a data item applied to the cell by bit lines, the comparison result being obtained on a selection line S, characterized in that the second array (T1,T2,T3,T4) of transistors comprises some of the transistors of the first array (T3,T4,T7,T8,T5,T6) connected to be operated by the stored data item to compare the date item applied with the stored data item.

2. Memory cell for a static associative memory according to claim 1, characterized in that the first array comprises four transistors (T3,T4,T7,T8) for storage purposes and two access transistors (T5,T6) connected to the bit lines and to a word line and in that the second array comprises two transistors, the two transistors (T3 and T4) of both arrays being associated with the two transistors of the second array in order to fulfil the comparison function, the data item to be compared being applied to bit lines connected to the two access transistors of the cell and the selection line S is preloaded during reading-writing operations and comparisons.

3. Memory cell for an associative memory according to claim 1, characterized in that the first array comprises four transistors (T3,T4,T7,T8) for the storage and two access transistors (T5,T6) connected to the bit lines and to a word line and in that the second array comprises two transistors, the two transistors (T3 and T4) of both arrays being associated with the two transistors of the second array for fulfilling the comparison function, the data item to be compared being applied to bit lines COMP and $\overline{\text{COMP}}$ connected to the two transistors of the second array.

4. Memory cell according to claim 1, characterized in that it is formed in CMOS technology.

5. Memory cell, according to any one of the preceding claims, characterized in that it comprises a memory plane constituted by an array of memory cells.

* * * * *

UNITED STATES PATENT AND TRADEMARK OFFICE
CERTIFICATE OF CORRECTION

PATENT NO. : 5,386,379
DATED : January 31, 1995
INVENTOR(S) : Ali-Yahia, et. al.

It is certified that error appears in the above-indentified patent and that said Letters Patent is hereby corrected as shown below:

Title page, item [54] and col. 1, line 1, in the Title should read--
MEMORY DEVICE FOR HIGH-DENSITY CONTENT ADDRESSABLE MEMORY--.

Column 5, line 44, delete "COMP" and insert --$\overline{COMP}$--.

Signed and Sealed this

Ninth Day of May, 1995

Attest:

BRUCE LEHMAN

*Attesting Officer*    *Commissioner of Patents and Trademarks*